United States Patent
Lim et al.

(10) Patent No.: US 7,235,411 B2
(45) Date of Patent: Jun. 26, 2007

(54) METHOD FOR ALIGNING A WAFER AND APPARATUS FOR PERFORMING THE SAME

(75) Inventors: Kyu-Hong Lim, Suwon-si (KR); Byung-Am Lee, Suwon-si (KR); Joo-Woo Kim, Seoul (KR); Chang-Hoon Lee, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 388 days.

(21) Appl. No.: 10/883,711

(22) Filed: Jul. 6, 2004

(65) Prior Publication Data
US 2005/0009214 A1 Jan. 13, 2005

(30) Foreign Application Priority Data
Jul. 7, 2003 (KR) .................. 10-2003-0045758

(51) Int. Cl.
*H01L 21/00* (2006.01)
(52) U.S. Cl. .................. 438/5; 257/E21.525; 382/151
(58) Field of Classification Search .................. 438/5, 438/16; 382/151; 348/87
See application file for complete search history.

(56) References Cited

U.S. PATENT DOCUMENTS

| 6,363,168 | B1 | 3/2002 | Kakuma |
| 2006/0126916 | A1* | 6/2006 | Kokumai .................. 382/151 |

FOREIGN PATENT DOCUMENTS

| JP | 2002-8028 | 1/2002 |
| KR | 2003-0024363 | 3/2003 |

* cited by examiner

*Primary Examiner*—Bradley K Smith
(74) *Attorney, Agent, or Firm*—Lee & Morse, P.C.

(57) ABSTRACT

In a method of aligning a wafer, which is capable of precisely and rapidly aligning the wafer, and a wafer alignment apparatus using the method of aligning the wafer, a first wafer is aligned to form a first template pattern corresponding to an image of the first wafer. Image data of a second wafer is inputted. A kind of the second wafer is different from that of the first wafer. A second template pattern is formed by transforming the first template pattern in response to the image data of the second wafer. The second wafer is then aligned in response to the second template pattern. Accordingly, the template pattern is formed using the image data to align the wafer although wafers having different images are inspected, thereby rapidly forming the template pattern.

12 Claims, 7 Drawing Sheets

METHOD FOR ALIGNING A WAFER AND APPARATUS FOR PERFORMING THE SAME

BACKGROUND OF THE INVENTION

1. Field of the Invention

The present invention relates to a method of aligning a wafer and a wafer alignment apparatus for performing the same. More particularly, the present invention relates to a method of aligning a wafer, which is capable of precisely and rapidly aligning the wafer, and a wafer alignment apparatus for performing the same.

2. Description of the Related Art

During various semiconductor manufacturing processes, a wafer is aligned at a predetermined location. These semiconductor manufacturing processes may include an inspection process for inspecting a surface of the wafer, a photolithography process, an electric die sorting (EDS) process, and others. In particular, the wafer should be accurately aligned in the inspection process so that a precise image is displayed on inspection equipment. The inspection process may be performed during or after the semiconductor manufacturing processes. The wafer should be rapidly inspected to improve a productivity of the semiconductor device.

The wafer may be aligned in an exposure unit in a photolithography process so that the semiconductor has a narrow line width. When the wafer is accurately aligned, the exposure unit prints a pattern on a surface of the wafer.

In a conventional method of aligning an exposure device, primary data is stored, and a wafer is introduced into the exposure device to form an image of the entire wafer, thereby forming an image file. The wafer is exposed using the image file. In accordance with this conventional method, however, a wafer having an image that is different from the stored image may not be rapidly inspected.

When a wafer having a different image is to be aligned, the whole surface of the wafer having the different image must be scanned to form a template pattern after the wafer having the different image is introduced into the wafer alignment apparatus.

Thus, when a kind of the wafer is changed, the whole surface of the wafer is scanned, thereby decreasing the productivity of the semiconductor device.

SUMMARY OF THE INVENTION

The present invention is therefore directed to a method of aligning a wafer and a wafer aligning apparatus, which substantially overcome one or more of the problems due to the limitations and disadvantages of the related art.

It is a feature of an embodiment of the present invention to provide a method of aligning a wafer, which is capable of precisely and rapidly aligning the wafer.

It is another feature of an embodiment of the present invention to provide a wafer alignment apparatus that is suitable for performing the above method.

At least one of the above features and other advantages may be provided by a method of aligning a wafer including aligning a first wafer to form a first template pattern corresponding to an image of the first wafer, inputting image data of a second wafer, a kind of the second wafer being different from that of the first wafer, forming a second template pattern by transforming the first template pattern in response to the image data of the second wafer, and aligning the second wafer in response to the second template pattern.

In the method, forming the first template pattern may include performing a first preliminary alignment on the first wafer to identify a notch portion of the first wafer, performing a first main alignment on the first wafer after performing the first preliminary alignment, a deviation of the first main alignment being less than about 100 μm, performing a second main alignment on the first wafer after performing the first main alignment, a deviation of the second main alignment being less than about 10 μm, and forming the first template pattern corresponding to the image of the first wafer after performing the second main alignment. The method may further include storing the first template pattern, after the forming the first template pattern.

In the method, each of the first preliminary alignment, the first main alignment, and the second main alignment may determine an azimuth and a location of the first wafer.

In the method, forming the second template pattern may include encoding the image data of the second wafer to form second template data, reading the stored first template pattern, comparing the second template data with the first template pattern to form difference data, and transforming the first template pattern in response to the difference data to form the second template pattern.

Forming the second template pattern may further include interpolating the first template pattern in response to the difference data to form interpolated data corresponding to a new pixel that is disposed between pixels of a cell in the first template pattern.

In the method, aligning the second wafer may include loading the second wafer into an inspection equipment, performing a second preliminary alignment on the second wafer to identify a notch portion of the loaded second wafer, performing a third main alignment on the second wafer after performing the second preliminary alignment, a deviation of the third main alignment being less than about 100 μm, and performing a fourth main alignment on the second wafer after performing the third main alignment, a deviation of the fourth main alignment being less than about 10 μm.

In the method, performing the second preliminary alignment, the third main alignment, and the fourth main alignment may include transforming a two-dimensional image of the second wafer to a one-dimensional electrical signal, digitizing the one-dimensional electrical signal to a two-dimensional pixel, quantizing an intensity of the pixel to a predetermined level to encode the quantized intensity to form an image pattern, the intensity corresponding to a brightness of the pixel, calculating difference data corresponding to a difference between the image pattern and the second template pattern, determining a deviation between the image pattern and the second template pattern, and comparing whether the difference data is less than or equal to the deviation.

The method may further include unloading the second wafer when the difference is greater than the deviation, after comparing the difference data.

The method may further include equalizing image distribution of the image pattern, after forming the image pattern.

The method may further include binarizing the image pattern into black and white image data using a threshold value, prior to calculating the difference data.

The image data of the second wafer may include at least one of the group consisting of a horizontal width of a unit cell, a vertical length of a unit cell, a width of a raw decoder region, a width of a column decoder region, a width of a sense amplifier region, and a width of a sub-word driver region.

At least one of the above features and other advantages may be provided by a wafer alignment apparatus including a wafer transport unit for aligning a wafer, a photoelectric transforming unit for transforming a two-dimensional image of the wafer into a one-dimensional electrical signal, an image signal processing unit for transforming the one-dimensional electrical signal to a digitized template pattern, a memory unit for storing the template pattern, an input unit for providing image data of a wafer to be aligned, an encoder for encoding the image data to form template data, a processor for processing the template data and the template pattern to form a modified template pattern, and a controlling unit for controlling the wafer transport unit and the processor.

The apparatus may further include a display unit for receiving the template pattern from the processor and displaying the two-dimensional image of the wafer.

The image signal processing unit may further include an analog-digital converter for sampling the one-dimensional electrical signal with respect to a time series to quantize the sampled electrical signal to encode the quantized electrical signal to a digitized image signal, thereby defining a pixel, a color separating unit for separating each of red, green and blue signals from the digitized image, and a gray-scale converting circuit for converting the separated red, green and blue signals to a template pattern corresponding to an intensity of a gray-scale of the pixel.

The processor may further include a data selecting part for outputting the template data or the template pattern in response to a control signal of the controlling part, a comparing part for comparing the template pattern with the outputted signal of the data selecting part to output difference data, an interpolating part for interpolating the template pattern in response to the difference data, a pattern forming part for forming a new template pattern in response to the interpolated template pattern, and a calculating part for comparing the difference data with deviation deterministic data stored in the memory unit.

The processor may further include an equalizing part for equalizing image distribution of the template pattern and the outputted signal of the data selecting part. The processor may further include a thresholding part for binarizing the template pattern and the outputted signal of the data selecting part into black and white image data using a threshold value.

The memory unit may store a template pattern corresponding to a kind of the wafer and deviation deterministic data corresponding to a kind and an alignment of the wafer. The template pattern may include a plurality of template patterns.

According to the present invention, a template pattern is formed using image data to align a wafer, which facilitates rapid formation of the template pattern and alignment of the wafer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
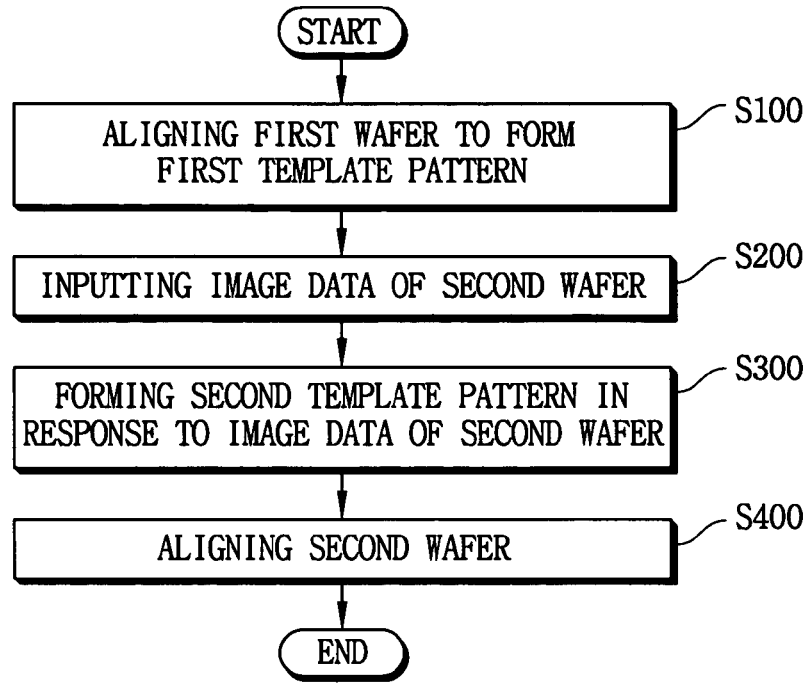
FIG. 1 is a flow chart illustrating a method of aligning wafers having different images in accordance with an exemplary embodiment of the present invention.

Korean Patent Application No. 2003-45758, filed on Jul. 7, 2003, in the Korean Intellectual Property Office, and entitled: "Method for Aligning a Wafer and Apparatus for Performing the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 6:
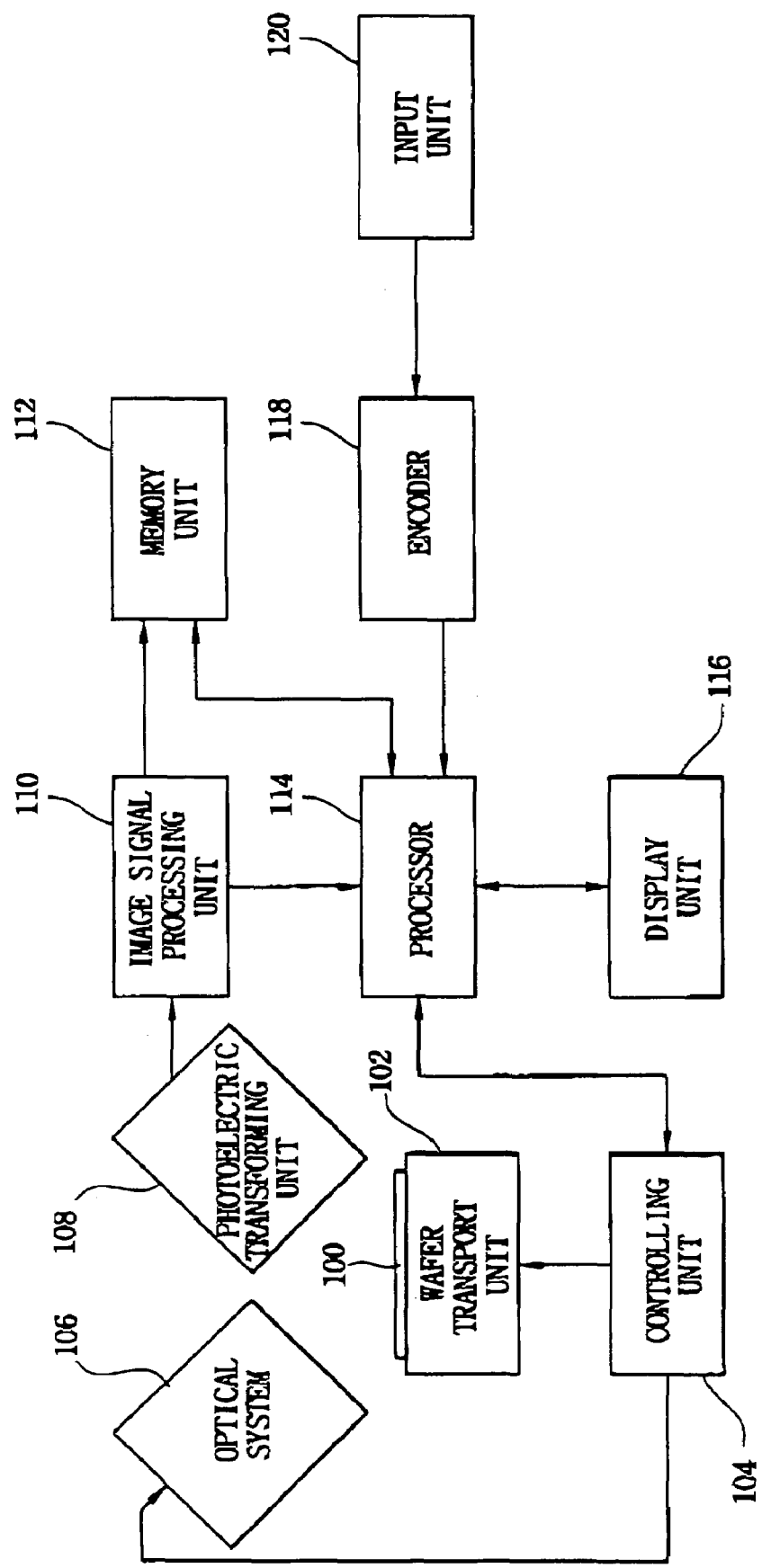
FIG. 6 illustrates a schematic view of a wafer alignment apparatus in accordance with an exemplary embodiment of the present invention.

FIG. 1 is a flow chart illustrating a method of aligning wafers having different images in accordance with an exemplary embodiment of the present invention. FIG. 6 illustrates a schematic view of a wafer alignment apparatus in accordance with an exemplary embodiment of the present invention.

Referring to FIGS. 1 and 6, a first wafer 100 is loaded onto the wafer alignment apparatus for purposes of aligning the first wafer 100. The wafer alignment apparatus may include a light irradiating member and a light sensing member. The light irradiating member includes an optical system 106 that irradiates light onto a surface of the first wafer 100. The light sensing member includes a photoelectric transforming unit 108 that senses light that is reflected/dispersed from the surface of the first wafer 100.

In step S100, the photoelectric transforming unit 108 senses an image formed by the reflected/dispersed light, i.e., a two-dimensional image of the wafer, transforms the two-dimensional image in a one-dimensional electrical signal and outputs the one-dimensional electrical signal to an image signal processing unit 110. The image signal processing unit 110 receives the one-dimensional electrical signal, transforms the one-dimensional electrical signal to a digitized template pattern and outputs a first template pattern.

More specifically, the image of the first wafer 100 is digitized to form the first template pattern that includes quantized gray-scale data corresponding to pixels, which form a frame. The first template pattern is stored in a memory unit 112 having a random access memory (RAM).

In step S200, image data of a second wafer is input into an encoder 118 from an input unit 120. An image of the second wafer is different from that of the first wafer 100. The encoder 118 receives the image data of the second wafer and encodes the image data to form second template data.

In step S300, a processor 114 receives the second template data in response to a control signal of a controlling unit 104. In addition, the processor 114 receives the first template pattern that is stored in the memory unit 112. The processor 114 processes the second template data and the first template pattern to form a second template pattern. That is, the first template pattern is transformed to form the second template pattern, and the second template data is a reference value for the transformation. The second template pattern is stored in the memory unit 112.

In step S400, the second wafer is loaded onto the wafer alignment apparatus for purposes of aligning the second wafer. A wafer transport unit 102 secures the second wafer, and transports the second wafer through circular, vertical and horizontal movements, as necessary, to align the second wafer.

The wafer alignment apparatus may include a display unit 116 electrically connected to the processor 114. The display unit 116 displays the image that is processed by the processor 114.

Figure 2:
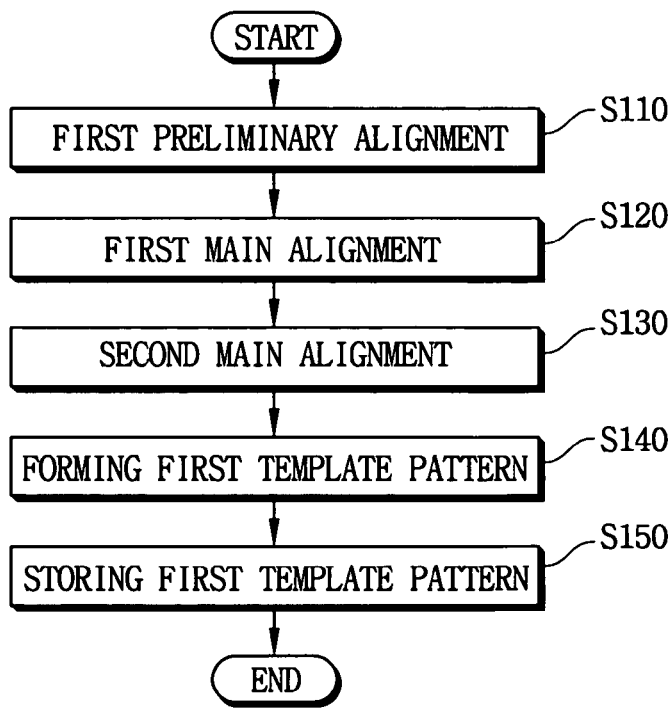
FIG. 2 is a flow chart illustrating a method of forming a first template pattern in accordance with an exemplary embodiment of the present invention.

FIG. 2 is a flow chart illustrating a method of forming a first template pattern in accordance with an exemplary embodiment of the present invention.

Referring to FIG. 2, in step S110, the first wafer is loaded into inspection equipment and a first preliminary alignment is performed to identify a notch portion of the first wafer. In order to identify the notch portion, the wafer transport unit 102 secures the first wafer. The wafer transport unit then rotates the first wafer, and horizontally transports the first wafer. Resultantly, an azimuth and a location of the first wafer are preliminarily determined.

In step S120, a first main alignment of the first wafer is performed. A deviation of the first main alignment is no more than about tens of micrometers (μm), i.e., the deviation of the first main alignment is less than about 100 μm. Thus, the precision of the first main alignment is superior to that of the first preliminary alignment.

In step S130, a second main alignment of the first wafer is performed. A deviation of the second main alignment is no more than about several micrometers, i.e., the deviation of the second main alignment is less than about 10 μm. Thus, the precision of the second main alignment is superior to that of the first main alignment. Resultantly, the azimuth and the location of the first wafer are determined by the first and second main alignments to a high precision.

In step S140, the wafer alignment apparatus forms a first template pattern after the first wafer is aligned.

In step S150, the first template pattern is stored in the memory unit 112.

Figure 7:
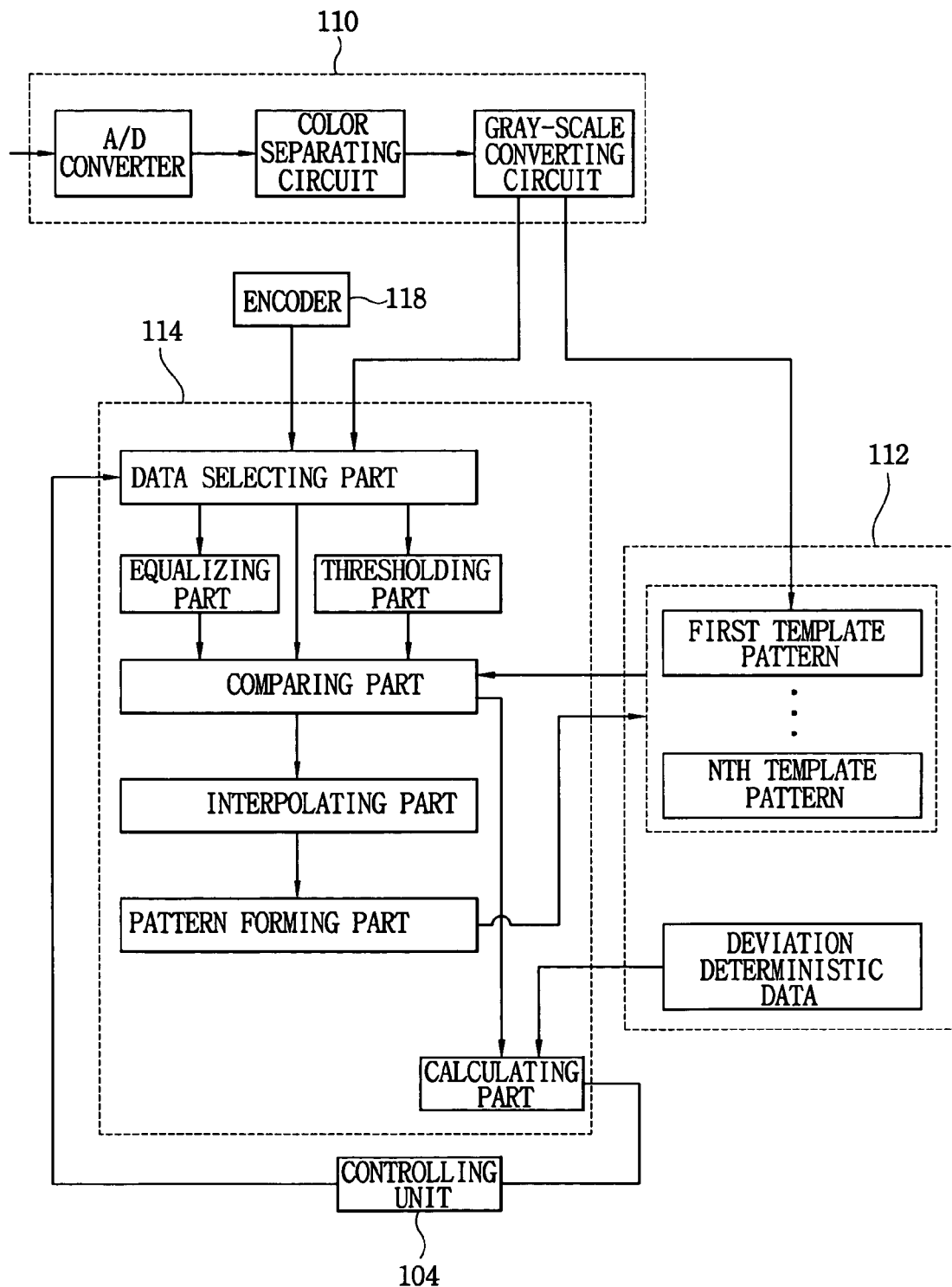
FIG. 7 is a block diagram illustrating an image signal processing unit, a processor and a memory unit in accordance with an exemplary embodiment of the present invention.

FIG. 7 is a block diagram illustrating the image signal processing unit 110, the processor 114 and the memory unit 112 in accordance with an exemplary embodiment of the present invention.

Referring to FIG. 7, the template pattern is formed using the image signal processing unit 110, the memory unit 112 and the processor 114. The image signal processing unit 110 includes an analog/digital (A/D) converter, a color separating circuit and a gray-scale converting circuit. The processor 114 includes a data selecting part, a comparing part, an interpolating part, a pattern forming part and a calculating part. The memory unit 112 includes a template pattern and deviation deterministic data. Alternatively, the memory unit 112 may include a plurality of template patterns, i.e., a first through an nth template pattern, as shown in FIG. 7.

The photoelectric transforming unit 108 transforms a two-dimensional image of the first wafer to a one-dimensional electrical signal having image data of the first wafer. The image data of the first wafer is an analog signal. The A/D converter of the image signal processing unit 110 receives the image data of the first wafer and digitizes the image data of the first wafer. The A/D converter performs several steps including a sampling step, a digitizing step, a quantizing step, encoding step, and others.

The analog signal is a one-dimensional time series electrical signal. The analog signal is sampled with respect to a time domain. The analog signal is digitized in a space domain. The space domain includes a plurality of points where the sampling step is performed. Each of the points corresponds to pixels that are picture elements. An intensity of the one-dimensional electrical signal, which is an amplitude of the analog signal, is sampled. The intensity corresponds to a brightness of the image.

The sampled intensity of the image data is quantized to determine the brightness of each of the pixels. The quantized intensity corresponds to one of several predetermined levels. For example, when the quantized intensity includes a binary number of 8 bits, the quantized intensity corresponds to 256 gray-scale levels. A black color and a white color correspond to 0 and 255, respectively. Various colors may be displayed using a mixture of a red (R) color, a green (G) color and a blue (B) color. Each of the red, green and blue colors includes 256 gray-scale levels that correspond to 8 bits. Therefore, the image data having a predetermined color includes 24 bits. A true color that includes about 16,000,000 colors may be displayed using 24 bits. Therefore, the one-dimensional time series electrical signal is sampled with respect to the time domain, and the sampled intensity is quantized to transform a continuous wave into a discontinuous pulse.

The quantized discontinuous pulse is encoded to form a code pulse corresponding to a predetermined value.

The A/D converter outputs the digitized image signal to the color separating circuit. The color separating circuit separates each of the red, green and blue signals from the digitized image signal.

The gray-scale converting circuit receives the separated red, green and blue signals and forms the first template pattern corresponding to the intensity of the gray-scale of each of the pixels.

Referring back to FIG. 2, in step S150, the gray-scale converting circuit stores the first template pattern in response to the control signal of the controlling unit.

Figure 3:
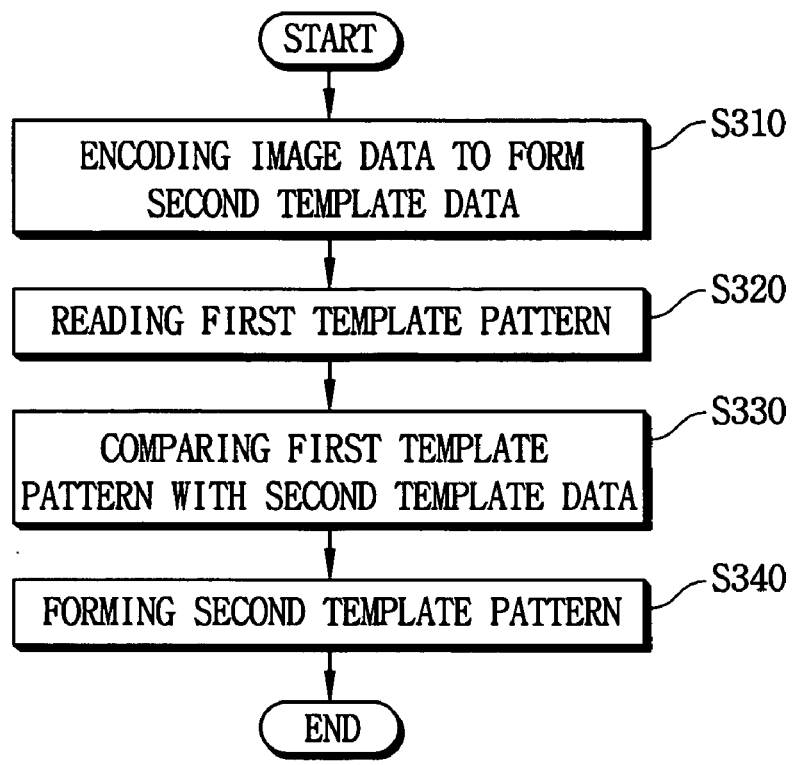
FIG. 3 is a flow chart illustrating a method of forming a second template pattern in accordance with an exemplary embodiment of the present invention.

FIG. 3 is a flow chart illustrating a method of forming a second template pattern in accordance with an exemplary embodiment of the present invention. FIG. 7 is a block diagram illustrating the image signal processing unit 110, the processor 114 and the memory unit 112 in accordance with an exemplary embodiment of the present invention.

Referring to FIGS. 3 and 7, the encoder 118 receives image data of the second wafer that is input from the input unit 120 (shown in FIG. 6). The image data of the second wafer may include a horizontal width of a unit cell, a vertical length of a unit cell, a width of a raw decoder region, a width of a column decoder region, a width of a sense amplifier region or a width of a sub-word driver region.

The image data of the second wafer, which is applied to the encoder 118, is transformed to form the second template data that is a binary code pulse. The data selecting part of the processor 114 may receive the second template data. The data selecting part outputs the second template data to the comparing part in response to the control signal of the controlling unit 104 (shown in FIG. 6). The data selecting part may also output the first template pattern. In step S320, the processor 114 reads the first template pattern that is stored in the memory unit 112 and outputs the template pattern to the comparing part. In step S330, the comparing part compares the first template pattern that is stored in the memory unit 112 with the second template data that is output from the data selecting part to output difference data. The comparing part outputs the difference data and the first template pattern to the interpolating part.

The interpolating part inserts the interpolated digital data into a new pixel that does not include the gray-scale data. That is, the interpolating part determines the interpolated digital data corresponding to the new pixel that does not include the gray-scale data using the gray-scale data of adjacent pixels, which corresponds to the first template pattern. The interpolated digital data is interpolated gray-scale data.

The interpolating part outputs the interpolated gray-scale data to the pattern forming part. In step S340, the pattern forming part encodes the intensity of the gray-scale data corresponding to the pixels formed by the interpolating part to form a new, i.e., a second, template pattern. The newly formed second template pattern is stored in the memory unit 112.

Figure 8:
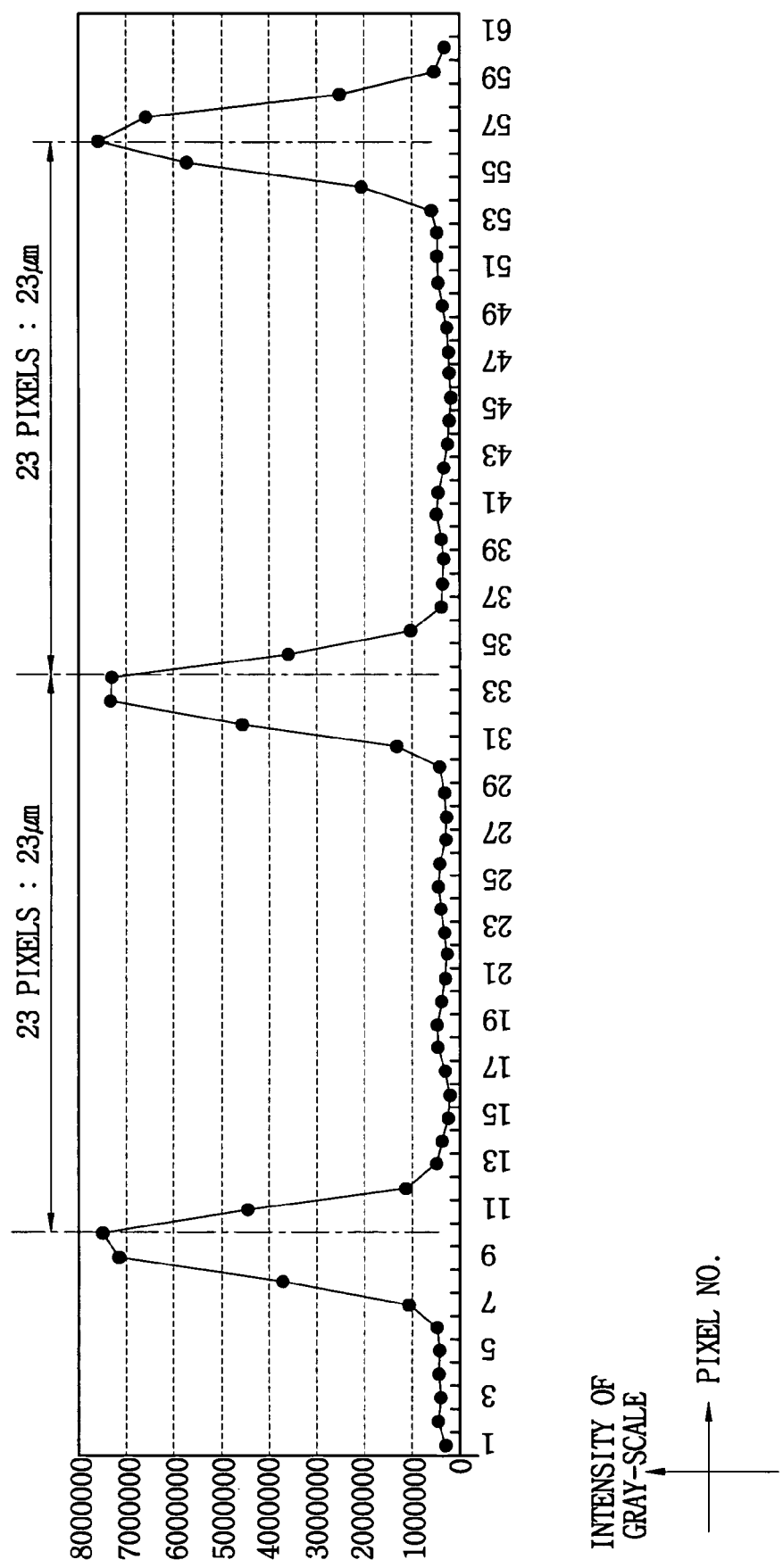
FIG. 8 is a graph illustrating a relationship between an intensity of a gray-scale and a pixel number.
Figure 9A:
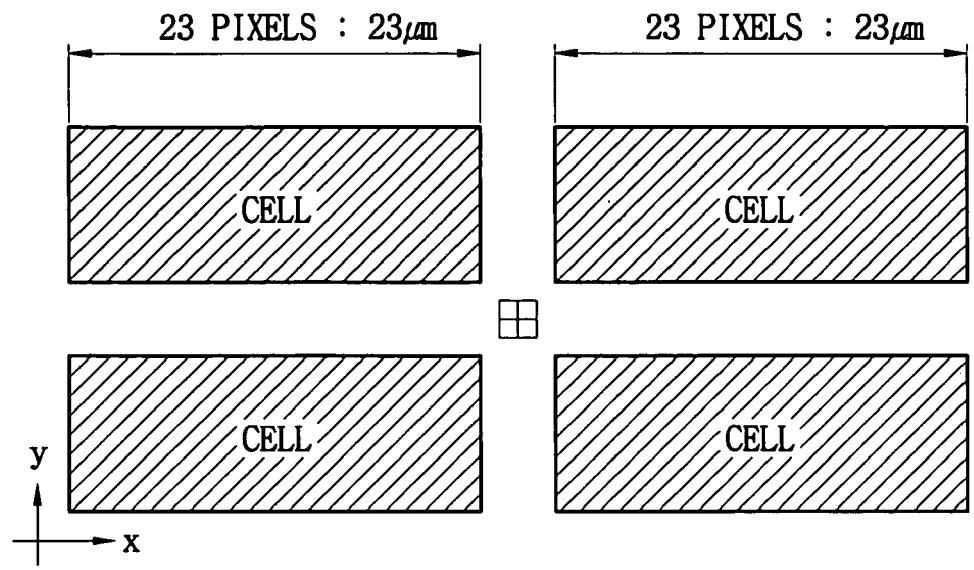
FIG. 9A illustrates a plan view of a wafer image before interpolation in accordance with an exemplary embodiment of the present invention.
Figure 9B:
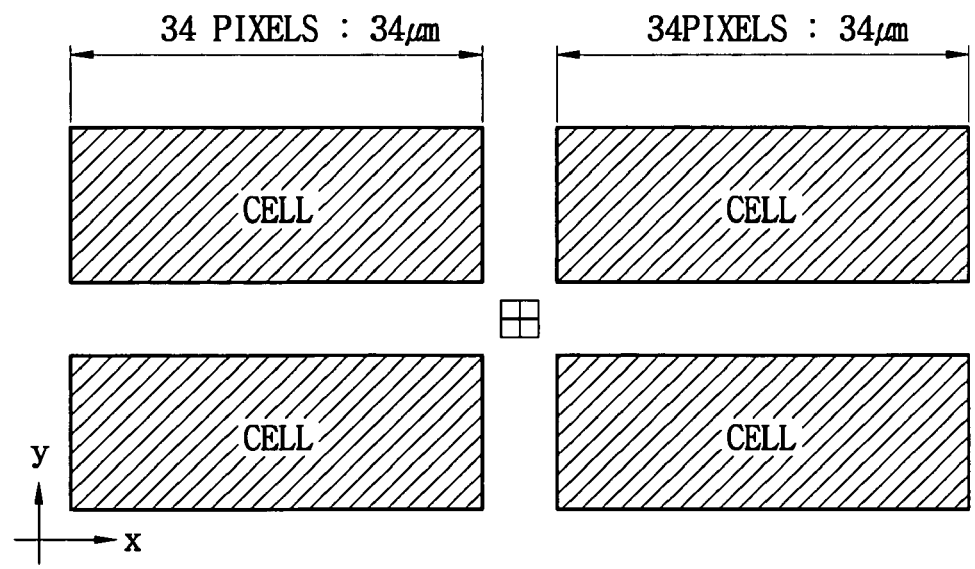
FIG. 9B illustrates a plan view of a wafer image after interpolation in accordance with an exemplary embodiment of the present invention.

FIG. 8 is a graph illustrating a relationship between an intensity of a gray-scale and a pixel number. FIG. 9A illustrates a plan view of a wafer image before interpolation in accordance with an exemplary embodiment of the present invention. FIG. 9B illustrates a plan view of a wafer image after interpolation in accordance with an exemplary embodiment of the present invention.

Referring to FIGS. 8, 9A and 9B, each cell of the first template pattern includes 23 pixels that are substantially parallel and aligned in an x-direction. A number of the pixels corresponding to each of the cells may be changed in response to a kind of wafer being aligned. A width of each of the pixels may be about 1 μm, and a height of each of the pixels may be about 1 μm. When a width of each cell of the second wafer is about 34 μm, the interpolating part defines 12 pixel data in response to the difference data and the first template data. The 12 pixel data are inserted into a space between 13th pixel data and 34th pixel data. The processor determines the intensity of the gray-scale data corresponding to the 12 pixel data in response to the gray-scale data corresponding to the first template pattern. Therefore, it is determined that 34 pixels that are aligned in the x-direction. Thirty-four (34) pixels that are aligned in a y-direction, which is substantially perpendicular to the x-direction, may also be determined by the above-described process.

The processor 114 may include a data equalizing part that equalizes image distribution of the template patterns. When the processor 114 receives the digitized image signal having an uneven image distribution, the data equalizing part equalizes the image distribution of the digitized image signal to output the equalized data to the comparing part.

The processor may also include a thresholding part that binarizes the image data having the gray-scale data into a black and white image data. The comparing part may receive the black and white image data. An operation of the thresholding part may be defined by equation 1:

$$f(x) = 255 \text{ if } x > T \quad (1)$$
$$0 \text{ if } x \leq T$$

wherein, T is a threshold value, and x is the gray-scale data of the image data corresponding to each of the pixels.

The threshold value (T) is a predetermined value between 0 and 255. When the gray-scale data (x) of the image data corresponding to each of the pixels is less than or equal to the threshold value (T), the intensity of the black and white image data corresponding to each of the pixels is zero (0). When the gray-scale data (x) of the image data corresponding to each of the pixels is greater than the threshold value (T), the intensity of the black and white image data corresponding to each of the pixels is 255. The maximum intensity of the gray-scale data is determined in response to the number of bits corresponding to each of the pixels.

Figure 4:
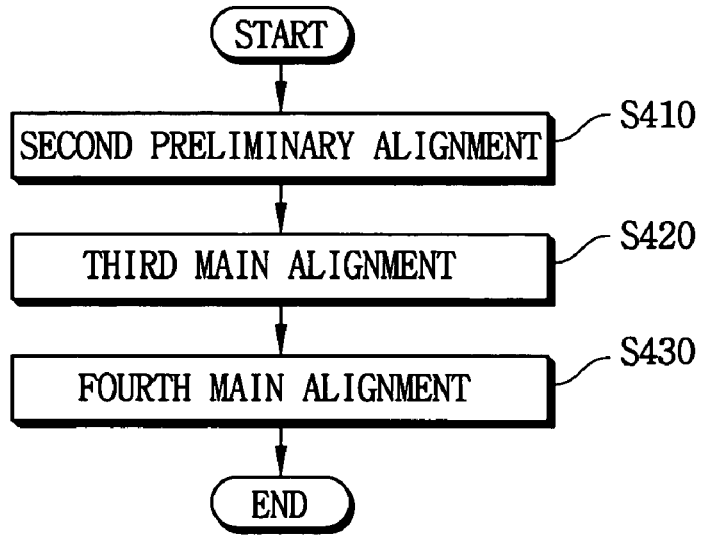
FIG. 4 is a flow chart illustrating a method of aligning a second wafer in accordance with an exemplary embodiment of the present invention.

FIG. 4 is a flow chart illustrating a method of aligning a second wafer in accordance with an exemplary embodiment of the present invention.

Referring to FIG. 4, in step S410, the second wafer is loaded into the inspection equipment and a second preliminary alignment is performed to identify a notch portion of the second wafer. In order to identify the notch portion, the wafer transport unit 102 (shown in FIG. 6) secures the second wafer. The wafer transport unit then rotates the second wafer, and horizontally transports the second wafer. Resultantly, an azimuth and a location of the second wafer are preliminary determined.

In step S420, a third main alignment of the second wafer is performed. A deviation of the third main alignment is no more than about tens of micrometers, i.e., the deviation of the third main alignment is less than about 100 μm. Thus, the precision of the third main alignment is superior to that of the second preliminary alignment.

In step S430, a fourth main alignment of the second wafer is performed. A deviation of the fourth main alignment is no more than about several micrometers, i.e., the deviation of the fourth main alignment is less than about 10 μm. Thus, the precision of the fourth main alignment is superior to that of the third main alignment. Resultantly, the azimuth and the location of the second wafer are determined by the third and fourth main alignments to a high precision.

Figure 5:
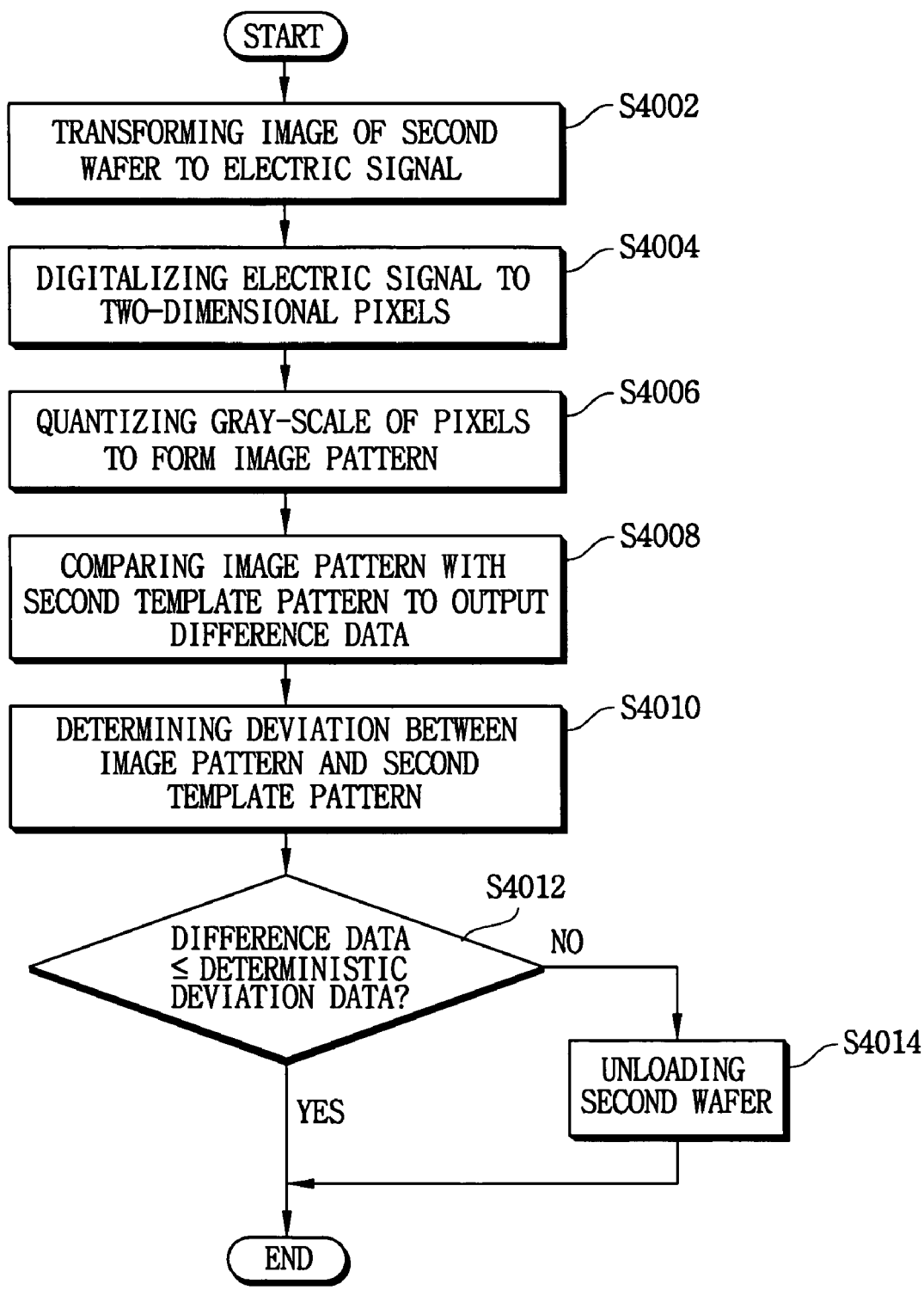
FIG. 5 is a flow chart illustrating a preliminary alignment and a main alignment of a second wafer in accordance with an exemplary embodiment of the present invention.

FIG. 5 is a flow chart illustrating a preliminary alignment and a main alignment of a second wafer in accordance with an exemplary embodiment of the present invention.

Referring to FIGS. 5 and 7, in step S4002, the photoelectric transforming unit 108 receives a two dimensional image of the second wafer and transforms the two-dimensional image into a one-dimensional electrical signal having the image data of the second wafer. In step S4004, the A/D converter digitizes the electrical signal to two-dimensional pixels. In step S4006, the A/D converter quantizes the digitized data. The color separating circuit and the gray-scale converting circuit then receive the quantized data and form an image pattern. The gray-scale converting circuit outputs the image pattern of the second wafer to the data selecting part of the processor in response to the control signal of the controlling unit. The data selecting part outputs the image pattern of the second wafer to the comparing part in response to the control signal of the controlling unit 104.

The processor reads the second template pattern of the second wafer, which is stored in the memory unit 112. The comparing part receives the second template pattern. In step S4008, the comparing part compares the second image pattern and the second template pattern that is stored in the memory unit and outputs difference data to the calculating part.

In step S4010, the calculating part reads the deviation deterministic data that is stored in the memory unit 112 to determine a deviation corresponding to each of the alignments. In step S4012, the calculating part compares the difference data and the deviation deterministic data. When an amount of the difference data is less than or equal to that of the deterministic deviation data, the calculating part outputs an alignment completion signal. When the amount of the difference data is greater than that of the deterministic deviation data, the calculating part outputs an alignment failure signal so that, in step S4014, the controlling unit controls the wafer transport unit to unload the second wafer from the wafer alignment apparatus.

Preferably, in step S4006, the image distribution of the image pattern may be equalized by an equalizing process after forming the image pattern.

In step S4008, the image pattern may be binarized using the threshold value, prior to the forming of the difference data corresponding to the difference between the image pattern and the second template pattern.

According to the present invention, the template pattern is formed using only the image data to align the wafer despite of wafers having different images inspected, thereby rapidly forming the template pattern.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of aligning a wafer, comprising:
    aligning a first wafer to form a first template pattern corresponding to an image of the first wafer;
    inputting image data of a second wafer, a kind of the second wafer being different from that of the first wafer;
    forming a second template pattern by transforming the first template pattern in response to the image data of the second wafer; and
    aligning the second wafer in response to the second template pattern.

2. The method as claimed in claim 1, wherein forming the first template pattern comprises:
    performing a first preliminary alignment on the first wafer to identify a notch portion of the first wafer;
    performing a first main alignment on the first wafer after performing the first preliminary alignment, a deviation of the first main alignment being less than about 100 μm;
    performing a second main alignment on the first wafer after performing the first main alignment, a deviation of the second main alignment being less than about 10 μm; and
    forming the first template pattern corresponding to the image of the first wafer after performing the second main alignment.

3. The method as claimed in claim 2, further comprising storing the first template pattern, after the forming the first template pattern.

4. The method as claimed in claim 3, wherein forming the second template pattern comprises:
    encoding the image data of the second wafer to form second template data;
    reading the stored first template pattern;
    comparing the second template data with the first template pattern to form difference data; and
    transforming the first template pattern in response to the difference data to form the second template pattern.

5. The method as claimed in claim 4, wherein forming the second template pattern further comprises interpolating the first template pattern in response to the difference data to form interpolated data corresponding to a new pixel that is disposed between pixels of a cell in the first template pattern.

6. The method as claimed in claim 2, wherein each of the first preliminary alignment, the first main alignment, and the second main alignment determines an azimuth and a location of the first wafer.

7. The method as claimed in claim 1, wherein aligning the second wafer comprises:
    loading the second wafer into an inspection equipment;
    performing a second preliminary alignment on the second wafer to identify a notch portion of the loaded second wafer;
    performing a third main alignment on the second wafer after performing the second preliminary alignment, a deviation of the third main alignment being less than about 100 μm; and
    performing a fourth main alignment on the second wafer after performing the third main alignment, a deviation of the fourth main alignment being less than about 10 μm.

8. The method as claimed in claim 7, wherein performing the second preliminary alignment, the third main alignment, and the fourth main alignment comprises:
    transforming a two-dimensional image of the second wafer to a one-dimensional electrical signal;
    digitizing the one-dimensional electrical signal to a two-dimensional pixel;
    quantizing an intensity of the pixel to a predetermined level to encode the quantized intensity to form an image pattern, the intensity corresponding to a brightness of the pixel;
    calculating difference data corresponding to a difference between the image pattern and the second template pattern;
    determining a deviation between the image pattern and the second template pattern; and
    comparing whether the difference data is less than or equal to the deviation.

9. The method as claimed in claim 8, further comprising unloading the second wafer when the difference is greater than the deviation, after comparing the difference data.

10. The method as claimed in claim 8, further comprising equalizing image distribution of the image pattern, after forming the image pattern.

11. The method as claimed in claim 8, further comprising binarizing the image pattern into black and white image data using a threshold value, prior to calculating the difference data.

12. The method as claimed in claim 1, wherein the image data of the second wafer comprises at least one of the group consisting of a horizontal width of a unit cell, a vertical length of a unit cell, a width of a raw decoder region, a width of a column decoder region, a width of a sense amplifier region, and a width of a sub-word driver region.

* * * * *